United States Patent
Okumura et al.

(10) Patent No.: US 6,291,937 B1
(45) Date of Patent: Sep. 18, 2001

(54) HIGH FREQUENCY COUPLER, AND PLASMA PROCESSING APPARATUS AND METHOD

(75) Inventors: Tomohiro Okumura, Kadoma; Shozo Watanabe, Katano, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/339,241

(22) Filed: Jun. 24, 1999

(30) Foreign Application Priority Data

Jun. 26, 1998 (JP) .................................................. 10-180093

(51) Int. Cl.[7] ...................................................... H01J 7/24
(52) U.S. Cl. .................. 315/111.21; 174/126.3; 174/133 R
(58) Field of Search ............................ 174/126.3, 129 R, 174/133 R, 28; 315/111.21

(56) References Cited

U.S. PATENT DOCUMENTS

| 90,578 | * | 5/1869 | Hunter | 174/133 R |
| 186,503 | * | 1/1877 | Snook | 174/133 R |
| 2,417,785 | * | 3/1947 | Slepian | 174/126.3 |
| 3,617,617 | * | 11/1971 | Katz | 174/120 |

* cited by examiner

*Primary Examiner*—Michael B Shingleton
(74) *Attorney, Agent, or Firm*—Wenderoth, Lind & Ponack L.L.P.

(57) ABSTRACT

A high frequency coupler wherein a section of the high frequency coupler cut by a plane perpendicular to a straight line which connects the center of a joint surface between the coupler and an output portion of a matching circuit and the center of a joint surface between the coupler and the antenna has a configuration such that the section contains a plurality of line segments arranged radially from a point adjacent the center of the section. This arrangement enables the flow of currents having good symmetry, uniform distribution of currents flowing on antenna, and uniform plasma generation.

27 Claims, 6 Drawing Sheets

HIGH FREQUENCY COUPLER, AND PLASMA PROCESSING APPARATUS AND METHOD

BACKGROUND OF THE INVENTION

The present invention relates to a high frequency coupler for coupling two high frequency elements, and also to plasma processing apparatus and method which utilize plasma generated by using high frequency electric power for fabrication of electronic devices, such as semiconductors, micro-machines, and the like.

FIG. 7 is a sectional view of an etching apparatus carrying an antenna system plasma source which has been already proposed by us. Referring to FIG. 7, when evacuation is carried out by a pump 3 operative as an evacuation device while a predetermined gas is introduced from a gas feeder 2 into a vacuum chamber 1, and when high-frequency electric power is supplied from a high frequency antenna power source 4 to an antenna 6 on a dielectric window 8 via a matching circuit 5 and a high frequency coupler 107 for coupling the matching circuit 5 to the antenna 6 while a predetermined pressure is maintained in the vacuum chamber 1, plasma is generated within the vacuum chamber 1 to enable plasma processing, such as etching, depositing, and surface modification, to be carried out with respect to a substrate 10 placed on a substrate electrode 9. In this case, as FIG. 7 shows, by supplying high frequency electric power to the substrate electrode 9 from a high frequency power source 11 for the substrate electrode, it is possible to control ion energy that would reach the substrate 10.

The high frequency coupler 107 is a coupler formed from a copper plate and, in case that the high frequency electric power to be supplied to the antenna is of a large magnitude, plural copper plates, superposed one over another, are used in order to increase the electric current capacity. The reason why a copper plate material comprised of copper plates placed one over another is preferred rather than a copper plate having its thickness merely increased is that high frequency provides a skin effect. That is, a high frequency current tends to flow only in the uppermost surface of a conductor and, therefore, in order to allow a large current flow, it is necessary to increase the surface area of the conductor.

However, the conventional system shown in FIG. 7 involves the problem of poor plasma uniformity.

The configuration of the copper plate is such that the copper plate is poorly symmetric in relation to the center of the antenna and, therefore, a current distribution will occur on the antenna under the influence of the electric current flowing in the copper plate. That is, the distribution of electric current flowing in the antenna shows such a non-uniformity as illustrated in FIG. 8. In order to uniformize the distribution of current, it is better that a cylindrical high-frequency coupler is us ed instead of the copper plate. In that case, however, there is a problem that the surface area of the high frequency coupler is too small to allow a large current flow.

Such a phenomenon as above mentioned is not a phenomenon which can be seen only with a plasma processing apparatus carrying a plasma source of antenna system. A similar phenomenon can be seen with a plasma processing apparatus of such a system as shown in FIG. 9 in which a high frequency electric power is supplied to an opposite electrode 21 and also with a plasma processing apparatus of such a system as shown in FIG. 10 in which a high frequency electric power is supplied to a substrate electrode 9 thereby to generate plasma.

SUMMARY OF THE INVENTION

An object of the present invention is to provide a high frequency coupler which can exhibit particularly good effect in the construction of a plasma processing apparatus capable of generating uniform plasmas, and to provide a plasma processing apparatus and method which can generate uniform plasmas.

In accomplishing these and other aspects, according to a first aspect of the present invention, there is provided a high frequency coupler for coupling first and second high frequency elements, a section of the coupler cut by a plane perpendicular to a straight line which connects a center of a joint surface between the coupler and the first high frequency element and a center of a joint surface between the coupler and the second high frequency element having a configuration such that the section contains a plurality of line segments arranged radially from an approximately center of the section.

According to a second aspect of the present invention, there is provided a high frequency coupler as set forth in the first aspect, wherein the radially arranged plurality of line segments are generally point-symmetrically arranged in relation to the center of the section of the coupler cut by the plane perpendicular to the straight line which connects the center of the joint surface between the coupler and the first high frequency element and the center of the joint surface between the coupler and the second high frequency element.

According to a third aspect of the present invention, there is provided a high frequency coupler as set forth in the first aspect, wherein the joint surface between the coupler and the first or second high frequency element is a generally circular plane.

According to a fourth aspect of the present invention, there is provided a high frequency coupler as set forth in the first aspect, wherein a tap for screwing-in a bolt is provided at the approximately center of the joint surface between the coupler and the first high frequency element, and a tap for screwing-in a bolt is provided at the approximately center of the joint surface between the coupler and the second high frequency element.

According to a fifth aspect of the present invention, there is provided a high frequency coupler as set forth in the first aspect, wherein a surface portion of the coupler in which a high frequency current flows is comprised of a material having an electric resistivity of not more than $2 \times 10^{-8}$ $\Omega \cdot m$.

According to a sixth aspect of the present invention, there is provided a plasma processing apparatus comprising:

a vacuum chamber;

a gas supply device for supplying gas into the vacuum chamber;

an evacuation device for evacuating an interior of the vacuum chamber;

an electromagnetic wave radiation device such as an antenna or an opposite side positioned electrode for allowing high frequency power to act on the interior of the vacuum chamber;

a high-frequency power source capable of supplying the high frequency power to the electromagnetic wave radiation device;

a matching circuit;

a high frequency coupler for coupling the matching circuit and the electromagnetic wave radiation device; and a substrate electrode for placing a substrate in the vacuum chamber, a section of the high frequency coupler cut by a plane perpendicular to a first straight line which connects a center of a joint surface between the high frequency coupler and an output portion of the matching circuit and a center of a joint surface between the high frequency coupler and the electromagnetic wave radiation device having, at a portion where the high frequency coupler contacts the electromagnetic wave radiation device, a configuration such that the section contains a plurality of line segments arranged radially from the approximately center of the section, and the first straight line passing about centrally through the substrate and being positioned on a second straight line in generally perpendicular relation to the substrate.

According to a seventh aspect of the present invention, there is provided a plasma processing apparatus as set forth in the sixth aspect, wherein the radially arranged plurality of line segments are generally point-symmetrically arranged in relation to the center of the section of the coupler cut by the plane perpendicular to the first straight line.

According to an eighth aspect of the present invention, there is provided a plasma processing apparatus as set forth in the sixth aspect, wherein the joint surface between the high frequency coupler and the output portion of the matching circuit or the joint surface between the high frequency coupler and the electromagnetic wave radiation device is a generally circular plane.

According to a ninth aspect of the present invention, there is provided a plasma processing apparatus as set forth in the sixth aspect, wherein a tap for screwing-in a first bolt is provided at the approximately center of the joint surface between the high frequency coupler and the output portion of the matching circuit, and a tap for screwing-in a second bolt is provided at the approximately center of the joint surface between the high frequency coupler and the electromagnetic wave radiation device, and wherein the high frequency coupler and the output portion of the matching circuit are fixed together by the first bolt and the high frequency coupler and the electromagnetic wave radiation device are fixed together by the second bolt.

According to a 10th aspect of the present invention, there is provided a plasma processing apparatus comprising:
  a vacuum chamber;
  a gas supply device for supplying gas into a vacuum chamber;
  an evacuation device for evacuating an interior of the vacuum chamber;
  a substrate electrode for placing a substrate thereon;
  a high frequency power source capable of supplying high frequency power to the substrate electrode;
  a matching circuit; and
  a high frequency coupler for coupling the matching circuit and the substrate electrode,
  a section of the high frequency coupler cut by a plane perpendicular to a first straight line which connects a center of a joint surface between the high frequency coupler and an output portion of the matching circuit and a center of a joint surface between the high frequency coupler and the substrate electrode having, at a portion where the high frequency coupler contacts the substrate electrode, a configuration such that the section contains a plurality of line segments arranged radially from an approximately center of the section, the first straight line passing about centrally through the substrate and being positioned on a second straight line which is nearly perpendicular to the substrate.

According to an 11th aspect of the present invention, there is provided a plasma processing apparatus as set forth in the 10th aspect, wherein the radially arranged plurality of line segments are generally point-symmetrically arranged in relation to the center of the section of the coupler cut by the plane perpendicular to the first straight line.

According to a 12th aspect of the present invention, there is provided a plasma processing apparatus as set forth in the 10th aspect, wherein the joint surface between the high frequency coupler and the output portion of the matching circuit or the substrate electrode is a generally circular plane.

According to a 13th aspect of the present invention, there is provided a plasma processing apparatus as set forth in the 10th aspect, wherein a tap for screwing-in a first bolt is provided at the approximately center of the joint surface between the high frequency coupler and the output portion of the matching circuit, and a tap for screwing-in a second bolt is provided at the approximately center of the joint surface between the high frequency coupler and the substrate electrode, and wherein the high frequency coupler and the output portion of the matching circuit are fixed together by the first bolt and the high frequency coupler and the substrate electrode are fixed together by the second bolt.

According to a 14th aspect of the present invention, there is provided a plasma processing apparatus as set forth in the 10th aspect, wherein a surface portion of the high frequency coupler in which a high frequency current flows is comprised of a material having an electric resistivity of not more than $2 \times 10^{-8}$ $\Omega \cdot m$.

According to a 15th aspect of the present invention, there is provided a plasma processing method comprising:
  evacuating an interior of a vacuum chamber while gas is fed into the vacuum chamber;
  with a pressure in the vacuum chamber being controlled to a predetermined pressure, supplying high frequency electric power, through a matching circuit and a high frequency coupler for coupling the matching circuit to an electromagnetic wave radiation device such as an antenna or an electrode opposite to the matching circuit, to the electromagnetic wave radiation device, so that current flows in a section of the high frequency coupler cut by a plane perpendicular to a first straight line which connects a center of a joint surface between the high frequency coupler and an output portion of the matching circuit and a center of a joint surface between the high frequency coupler and the electromagnetic wave radiation device, the section having a configuration such that the section contains a plurality of line segments for flowing the current, arranged radially from an approximately center of the section, the first straight line passing about centrally through a substrate placed on a substrate electrode and being positioned on a second straight line which is nearly perpendicular to the substrate; and
  generating plasma in the vacuum chamber for treating the substrate, the generated plasma being nearly symmetrical across the center of the substrate.

According to a 16th aspect of the present invention, there is provided a plasma processing method as set forth in the 15th aspect, wherein the current flows in the radially arranged plurality of line segments which are generally point-symmetrically arranged in relation to the center of the section of the high frequency coupler cut by the plane perpendicular to the first straight line.

According to a 17th aspect of the present invention, there is provided a plasma processing method as set forth in the 15th aspect, wherein the current flows in the joint surface between the high frequency coupler and the output portion of the matching circuit, and the current flows in the joint surface between the high frequency coupler and the electromagnetic wave radiation device, either one of the joint surfaces being a generally circular plane.

According to an 18th aspect of the present invention, there is provided a plasma processing method as set forth in the 15th aspect, wherein the current flows in a joint portion where the high frequency coupler and the output portion of the matching circuit are fixed together by a first bolt screwed in a tap provided at the approximately center of the joint surface between the high frequency coupler and the output portion of the matching circuit, and the current flows in a joint portion where the high frequency coupler and the electromagnetic wave radiation device are fixed together by a second bolt screwed in a tap provided at the approximately center of the joint surface between the high frequency coupler and the electromagnetic wave radiation device.

According to a 19th aspect of the present invention, there is provided a plasma processing method comprising:

evacuating an interior of a vacuum chamber while gas is fed into the vacuum chamber;

with a pressure in the vacuum chamber being controlled to a predetermined pressure, supplying high frequency electric power to a substrate electrode through a matching circuit and a high frequency coupler for coupling the matching circuit to the substrate electrode to the matching circuit, so that current flows in a section of the high frequency coupler cut by a plane perpendicular to a first straight line which connects a center of a joint surface between the high frequency coupler and an output portion of the matching circuit and a center of a joint surface between the high frequency coupler and the substrate electrode, the section having a configuration such that the section contains a plurality of line segments for flowing the current, arranged radially from an approximately center of the section, the first straight line passing about centrally through a substrate placed on the substrate electrode and being positioned on a second straight line which is nearly perpendicular to the substrate; and generating plasma in the vacuum chamber for treating the substrate, the generated plasma being nearly symmetrical across the center of the substrate.

According to a 20th aspect of the present invention, there is provided a plasma processing method as set forth in the 19th aspect, wherein the current flows in the radially arranged plurality of line segments which are generally point-symmetrically arranged in relation to the center of the section of the high frequency coupler cut by the plane perpendicular to the first straight line.

According to a 22st aspect of the present invention, there is provided a plasma processing method as set forth in the 19th aspect, wherein the current flows in the joint surface between the high frequency coupler and the output portion of the matching circuit, and the current flows in the joint surface between the high frequency coupler and the substrate electrode, either one of the joint surfaces being a generally circular plane.

According to a 22nd aspect of the present invention, there is provided a plasma processing method as set forth in the 19th aspect, wherein the current flows in a joint portion where the high frequency coupler and the output portion of the matching circuit are fixed together by a first bolt screwed in a tap provided at the approximately center of the joint surface between the high frequency coupler and the output portion of the matching circuit, and the current flows in a joint portion where the high frequency coupler and the substrate electrode are fixed together by a second bolt screwed in a tap provided at the approximately center of the joint surface between the high frequency coupler and the substrate electrode.

According to a 23rd aspect of the present invention, there is provided a plasma processing method as set forth in the 15th aspect, wherein the current flows in a surface portion of the high frequency coupler which is comprised of a material having an electric resistivity of not more than $10^{-8}$ $\Omega \cdot m$.

According to a 24th aspect of the present invention, there is provided a plasma processing method as set forth in the 19th aspect, wherein the current flows in a surface portion of the high frequency coupler which is comprised of a material having an electric resistivity of not more than $10^{-8}$ $\Omega \cdot m$.

According to a 25th aspect of the present invention, there is provided a plasma processing method as set forth in the 15th aspect, wherein the magnitude of the high frequency electric power is not less than 1 kW.

According to a 26th aspect of the present invention, there is provided a plasma processing method as set forth in the 19th aspect, wherein the magnitude of the high frequency electric power is not less than 1 kW.

According to a 27th aspect of the present invention, there is provided a plasma processing apparatus as set forth in the sixth aspect, wherein a surface portion of the high frequency coupler in which a high frequency current flows is comprised of a material having an electric resistivity of not more than $2 \times 10^{-8}$ $\Omega \cdot m$.

According to a 28th aspect of the present invention, there is provided a plasma processing apparatus as set forth in the sixth aspect, which is an etching apparatus.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
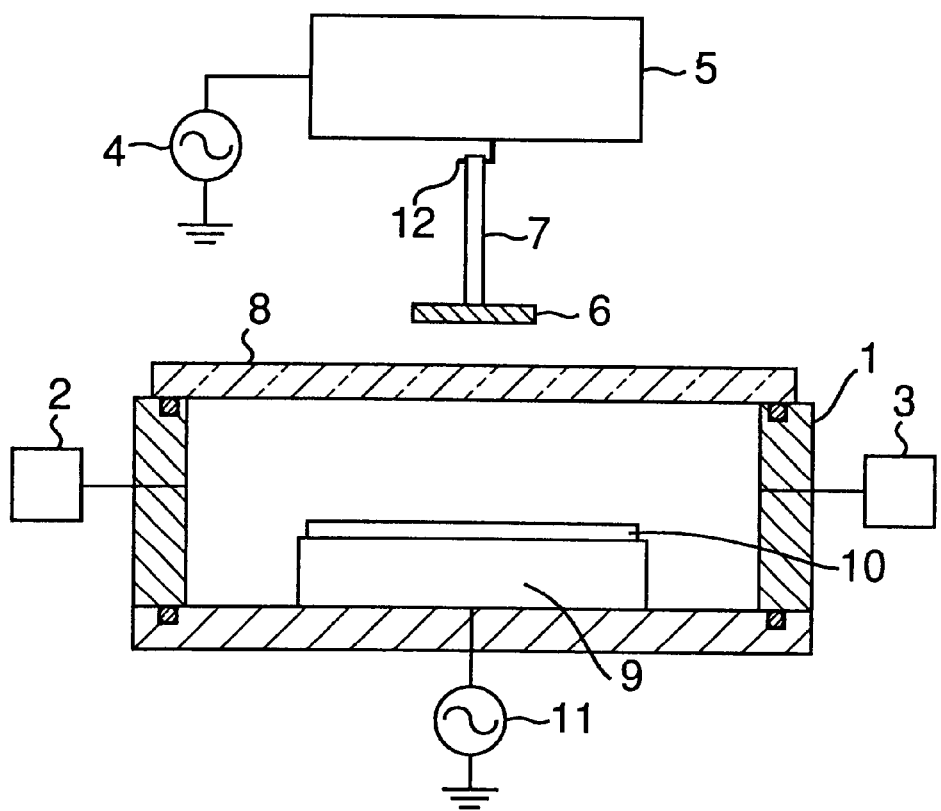
FIG. 1 is a sectional view showing the arrangement of a plasma processing apparatus employed in the first embodiment of the present invention.

Before the description of the present invention proceeds, it is to be noted that like parts are designated by like reference numerals throughout the accompanying drawings.

A first embodiment of the present invention will now be described with reference to FIGS. 1 to 4.

Referring to FIG. 1, there is shown a sectional view of a plasma processing apparatus employed in the first embodiment of the invention. In FIG. 1, when air or gas in a vacuum chamber is evacuated by a pump 3, serving as one example of an evacuating device, while a predetermined gas is introduced from a gas supply unit 2 into the vacuum chamber 1, and when a high frequency electric power of 100 MHz is supplied from an antenna-purpose high frequency power source 4 to an antenna 6 serving as one example of electromagnetic wave radiation device on a dielectric window 8 via a matching circuit 5 and a high frequency coupler 7 for coupling the matching circuit 5 and the antenna 6 while the interior of the vacuum chamber 1 is kept under a predetermined pressure, plasma is generated within the vacuum chamber 1 and this makes it possible to carry out various plasma treatments, such as etching, deposition, and surface modification on the substrate 10 placed on the substrate electrode 9. For supply of high frequency electric power to the substrate electrode 9 there is provided a high frequency power source 11 for the substrate electrode so that ion energies reaching the substrate 10 can be controlled.

Figure 2:
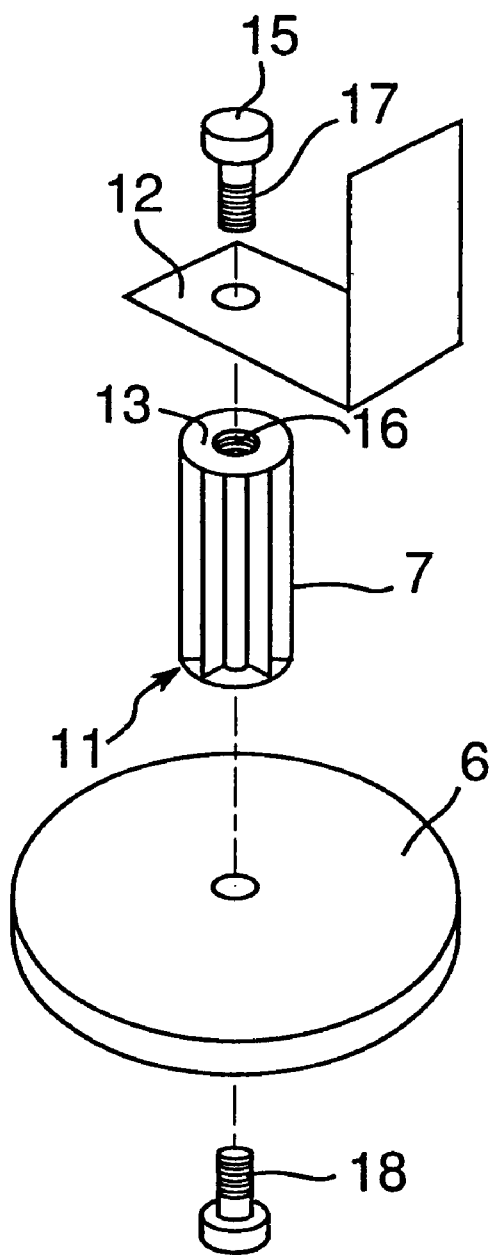
FIG. 2 is an exploded view of an output portion of a matching circuit, a high frequency coupler, and an antenna in the first embodiment of the present invention.

FIG. 2 is an exploded view in perspective showing an output portion 12 of the matching circuit 5, the high frequency coupler 7, and the antenna 6. As FIG. 2 shows, the joint surface between the high frequency coupler 7 and the output portion 12 of the matching circuit 5 is a generally circular plane, and the joint surface between the high frequency coupler 7 and the antenna 6 having a circular plate shape, a rod shape, or a coil shape and radiating electromagnetic waves is also configured to have a generally circular plane shape. A tap 16 for screwing a first bolt in is provided adjacent the center (at the approximately center) of the joint surface 13 between the high frequency coupler 7 and the output portion 12 of the matching circuit 5 so that the high frequency coupler 7 and the output portion 12 of the matching circuit 5 are fixed together by the first bolt 17, and a tap 16 for screwing a second bolt in are provided adjacent the center (at the approximately center) of the joint surface 14 between the high frequency coupler 7 and the antenna 6 so that the high frequency coupler 7 and the antenna 6 are fixed together by the second bolt 18. The parent material of the high frequency coupler 7 is copper and, therefore, the surface portion of the coupler 7 is silver-plated so as to prevent surface oxidation and further reduce the electric resistance of the surface portion in which a high frequency electric current flows.

Figure 3:
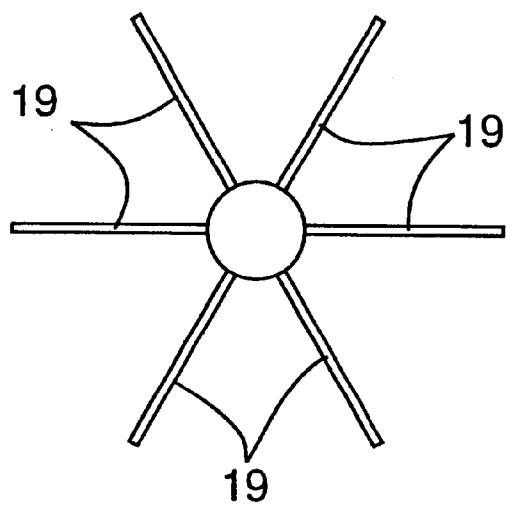
FIG. 3 is a sectional view of the high frequency coupler in the first embodiment of the present invention.

FIG. 3 is a sectional view showing a section of the high frequency coupler 7 cut along a plane perpendicular to a straight line 15 connecting the center of the joint surface 13 between the high frequency coupler 7 and the output portion 12 of the matching circuit 5 and the center of the joint surface 14 between the high frequency coupler 7 and the antenna 6. As FIG. 3 shows, the high frequency coupler 7 has a configuration such that a section thereof contains a plurality of line segments 19 radially arranged from a point adjacent the center (from the approximately center) of the section. The radially arranged plurality of line segments 19 are disposed in a substantially point-symmetrical fashion about (fashion of center-of-symmetry or point-of-symmetry with respect to) the center of the section. It may be appreciated from FIGS. 1 to 3 that the straight line 15 connecting the center of the joint surface between the high frequency coupler 7 and the output portion 12 of the matching circuit 5 and the center of the joint surface 14 between the high frequency coupler 7 and the antenna 6 passes through a portion approximate to the center of the substrate 10 and is positioned on a straight line which is substantially perpendicular to the substrate 10.

Figure 4:
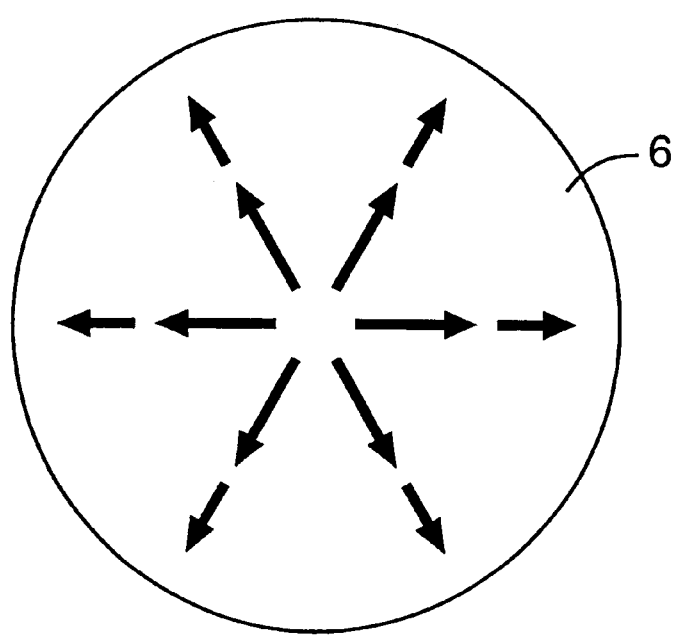
FIG. 4 is a view showing the distribution of current flowing in the antenna in the first embodiment of the present invention.
Figure 8:
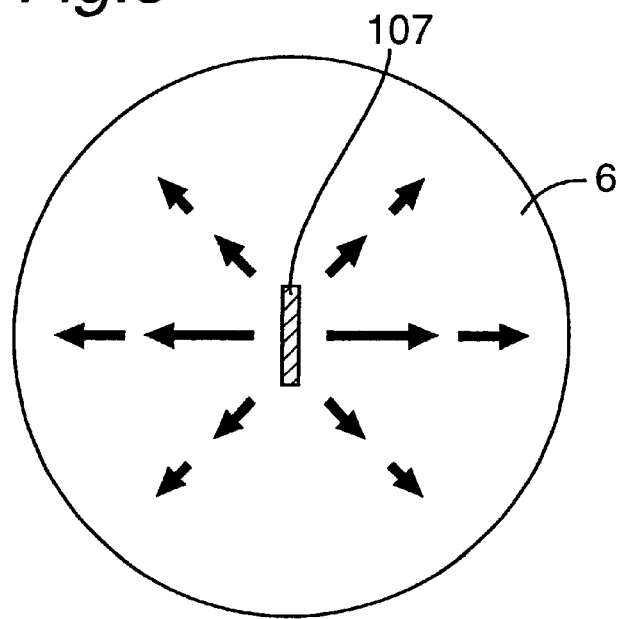
FIG. 8 is a view showing the distribution of current flowing in an antenna of the prior art example.
Figure 9:
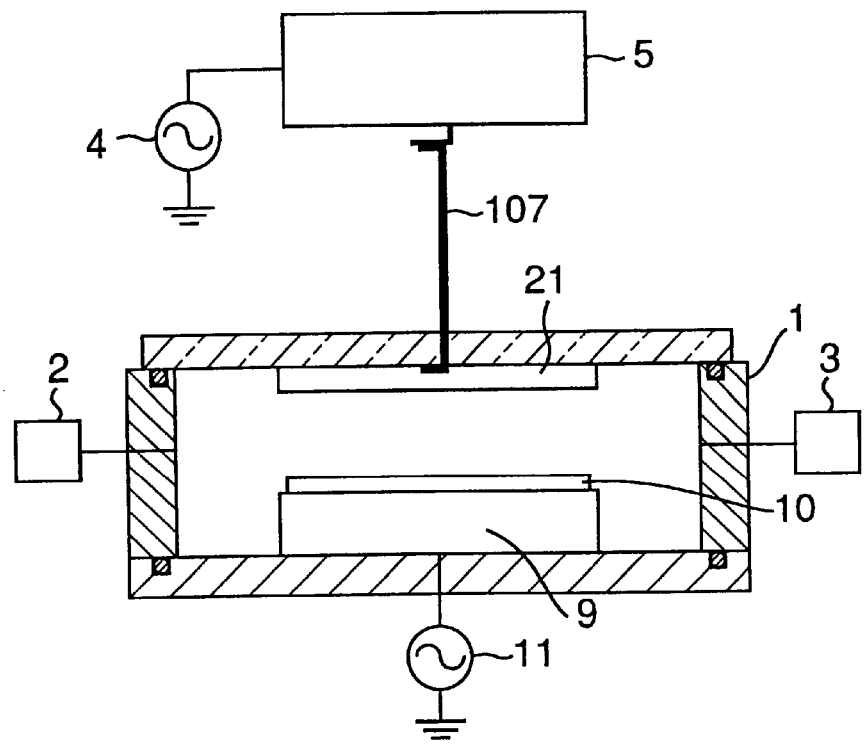
FIG. 9 is a sectional view showing the construction of a plasma processing apparatus employed in a conventional example.
Figure 10:
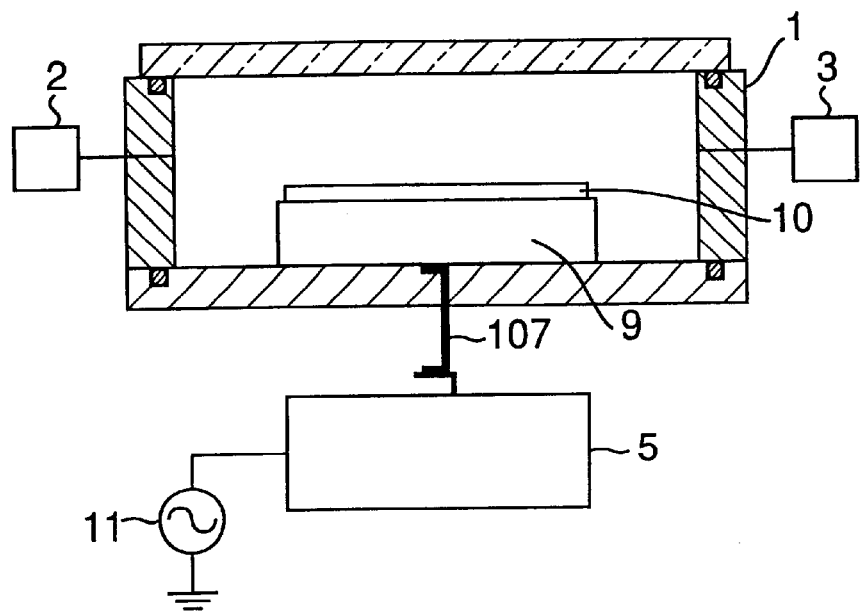
FIG. 10 is a sectional view of the construction of a plasma processing apparatus used in prior art example.

FIG. 4 shows a distribution of electric currents flowing in the antenna 6. As may be appreciated from FIG. 4, the configuration of the high frequency coupler 7 shows a high symmetry in relation to the center of the antenna 6 and, therefore, as compared with the prior art example shown in FIG. 8, the high frequency coupler 7 exhibits uniform current distribution. As a result, uniform plasma is generated within the vacuum chamber 1, so that plasma processing can be carried out with good uniformity. Further, in the high frequency coupler 7, the surface area of the portion in which electric current flows corresponds to plural copper plates superposed one over another, and this allows a large flow of electric current.

In the foregoing description of the first embodiment of the present invention, only some of various variations conceivable with respect to the configuration of the vacuum chamber 1, the shape and the arrangement of the antenna 6, the shape and the disposition of the dielectric window 8, which fall within the scope of the present invention, are shown by way of example. It is needless to say that various variations other than those exemplified herein may be conceivable in the application of the invention. For example, in the foregoing description of the embodiment of the present invention, the antenna 6 is circular, but the antenna 6 may be polygonal, elliptic, or otherwise.

In the foregoing description of the first embodiment of the present invention, the plural line segments 19 arranged in the radial fashion which appear on the section of the high frequency coupler 7 cut by the plane perpendicular to the straight line 15 connecting the center of the joint surface 13 between the high frequency coupler 7 and the output portion 12 of the matching circuit 5 to the center of the joint surface 14 between the high frequency coupler 7 and the antenna 6 are disposed in an approximate point symmetry relative to the center of the section. In this case, the higher the degree of symmetry, the more uniform current distribution on the antenna 6 can be obtained. In the foregoing description, line segments 19 are six in number by way of example. It is noted, however, that the larger the number of line segments, the greater uniformity can be obtained with respect to the current distribution on the antenna 6, resulting in greater current capacity.

In the above described first embodiment of the present invention, the joint surface 13 between the high frequency coupler 7 and the output portion 12 of the matching circuit 5 is an approximately circular plane, and the joint surface 14 between the high frequency coupler 7 and the antenna 6 is also an approximately circular plane. However, the joint surface 13 or 14 need not necessarily be a circular plane; and of course, various variations other than those exemplified herein may be conceivable depending upon the configuration of the joint portion.

In the above described first embodiment of the present invention, taps for screwing-in a bolt are provided adjacent the center of the joint surface 13 between the high frequency coupler 7 and the output portion 12 of the matching circuit 5 and adjacent the center of the joint surface 14 between the high frequency coupler 7 and the antenna 6, so that the high frequency coupler 7 and the output portion 12 of the matching circuit 5 is fixed by the bolt 17 and so that the high frequency coupler 7 and the antenna 6 are fixed by the bolt 18. Such arrangement facilitates the mounting/removing of the matching circuit 5 and the antenna 6. Where the ease of the mount/remove operation is not so important, however, connection of the matching circuit 5, the high frequency coupler 7, and the antenna 6 is possible by other means, such as welding or integral molding.

In the above description of the first embodiment of the present invention, the frequency of the high frequency electric power is 100 MHz; needless to say, however, the frequency is not limited to this value.

Next, a second embodiment of the present invention will be described with reference to FIG. 5.

Figure 5:
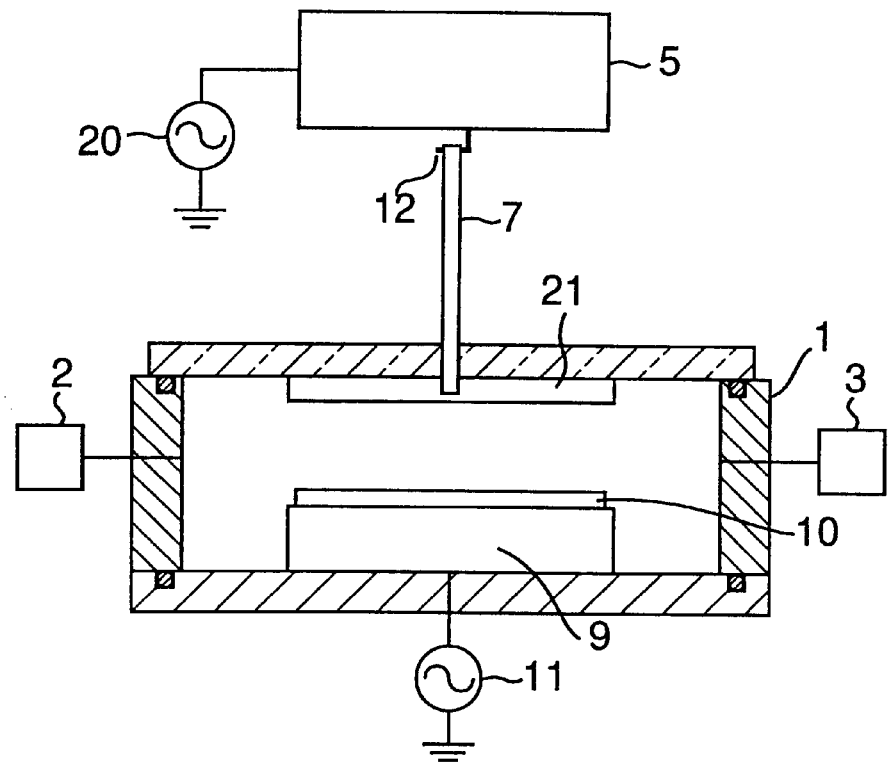
FIG. 5 is a sectional view showing the construction of the plasma processing apparatus used in the second embodiment of the present invention.

In FIG. 5, there is shown a sectional view of a plasma processing apparatus employed in the second embodiment. In FIG. 5, when the interior of a vacuum chamber 1 is evacuated by a pump 3 operative as an evacuation device while a predetermined gas is introduced from a gas supply unit 2 into the chamber 1, and when a high-frequency electric power of 27 MHz is supplied to an opposite side positioned electrode 21, serving as one example of electromagnetic wave radiation device, by a high-frequency power source 20 for the opposite side positioned electrode via a matching circuit 5 and a high frequency coupler 7 for coupling the matching circuit 5 and the opposite side positioned electrode 21 while the interior of the vacuum chamber 1 is kept under a predetermined pressure, plasma generation occurs in the vacuum chamber 1 and this enables plasma processing, such as etching, deposition, and surface modification, with respect to a substrate 10 mounted on a substrate electrode 9. The substrate electrode 9 is connected to a high frequency power source 11 for the substrate electrode which is intended for supplying high frequency power to the substrate electrode 9 so as to enable control of ion energies reaching the substrate 10.

An exploded view of the output portion 12 of the matching circuit 5, the high frequency coupler 7, and the opposite side positioned electrode 21, as well as description thereof, is omitted since it is same as that shown in FIG. 2, except that the antenna 6 is replaced by the opposite side electrode 21.

A sectional view showing a section of the high frequency coupler 7 cut by a plane perpendicular to a straight line 15 connecting the center of a joint surface between the high frequency coupler 7 and the output portion 12 of the matching circuit 5 and the center of a joint surface between the high frequency coupler 7 and the opposite side electrode 21 is same as that of FIG. 3. Therefore, the sectional view and the description are omitted.

Current distribution on the opposite electrode 21 is same as that in FIG. 4, except that the antenna 6 is replaced by the opposite electrode 21. Therefore, the drawing and the description is omitted.

In this way, where high frequency electric power is supplied to the opposite side electrode 21 to cause plasma generation in the vacuum chamber 1, it is possible to carry out uniform plasma processing by application of the present invention.

In the foregoing description of the second embodiment of the present invention, only some of various variations conceivable with respect to the configuration of the vacuum chamber 1, and the shape and the disposition of the opposite side electrode 21, which fall within the scope of the present invention, are shown by way of example. It is needless to say that various variations other than those exemplified herein may be conceivable in the application of the present invention. For example, in the embodiment of the present invention, the opposite side electrode 21 is circular, but the opposite side electrode 21 may be configured to be polygonal, elliptic, or otherwise.

In the foregoing description of the second embodiment of the present invention, plural line segments 19 arranged in a radial fashion which appear on a section of the high frequency coupler 7 cut by a plane perpendicular to a straight line 15 connecting the center of the joint surface 13 between the high frequency coupler 7 and the output portion 12 of the matching circuit 5 to the center of the joint surface 14 between the high frequency coupler 7 and the opposite side electrode 21 are disposed in an approximate point symmetry about the center of the section. In this case, the higher the degree of symmetry, the more uniform current distribution on the opposite side electrode 21 can be obtained. In the foregoing description, the line segments 19 are six in number by way of example. It is noted, however, that the larger the number of the line segments 19, the greater uniformity can be obtained with respect to the current distribution on the opposite side electrode 21, resulting in greater current capacity.

In the above described second embodiment of the present invention, the joint surface between the high frequency coupler 7 and the output portion 12 of the matching circuit 5 is an approximately circular plane, and the joint surface between the high frequency coupler 7 and the opposite side electrode 21 is also an approximately circular plane. However, the joint surface need not necessarily be a circular plane; and of course, various variations other than those exemplified herein may be conceivable depending upon the configuration of the joint portion.

In the above described second embodiment of the present invention, a tap for screwing-in a bolt is respectively provided adjacent the center of the joint surface between the high frequency coupler 7 and the output portion 12 of the matching circuit 5 and adjacent the center of the joint surface between the high frequency coupler 7 and the opposite side electrode 21, so that the high frequency coupler 7 and the output portion 12 of the matching circuit 5 is fixed by the bolt and so that the high frequency coupler 7 and the opposite side electrode are fixed by the bolt. Such arrangement facilitates the mounting/removing of the matching circuit 5 and the opposite side electrode 21. Where the ease of the mount/remove remove operation is not so important, however, the connection of the matching circuit 5, the high frequency coupler 7, and the opposite side electrode 21 is possible by other means, such as welding or integral molding.

In the above described second embodiment of the present invention, the frequency of the high frequency electric power is 27 MHz; needless to say, however, the frequency is not limited to this value.

Next, a third embodiment of the present invention will be described with reference to FIG. 6.

Figure 6:
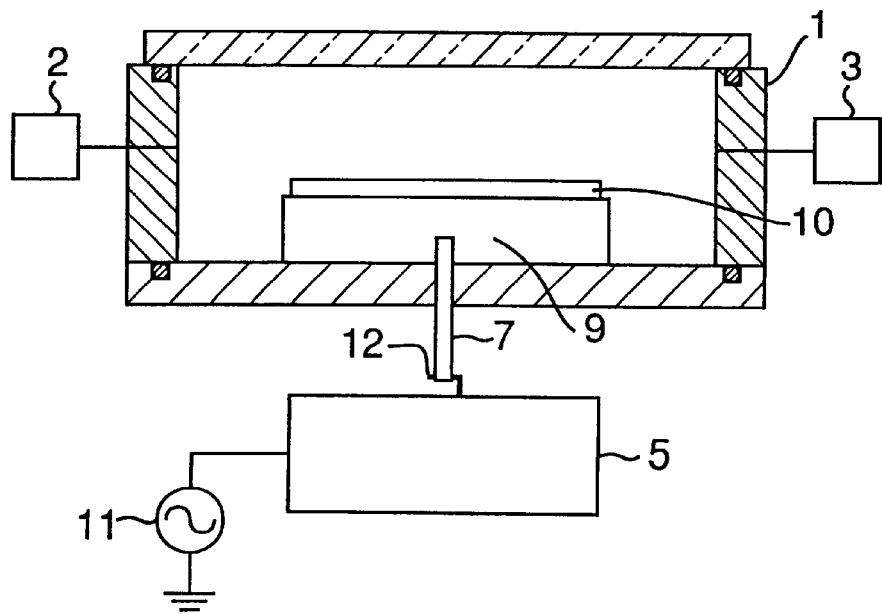
FIG. 6 is a sectional view showing the construction of the plasma processing apparatus used in the third embodiment of the present invention.
Figure 7:
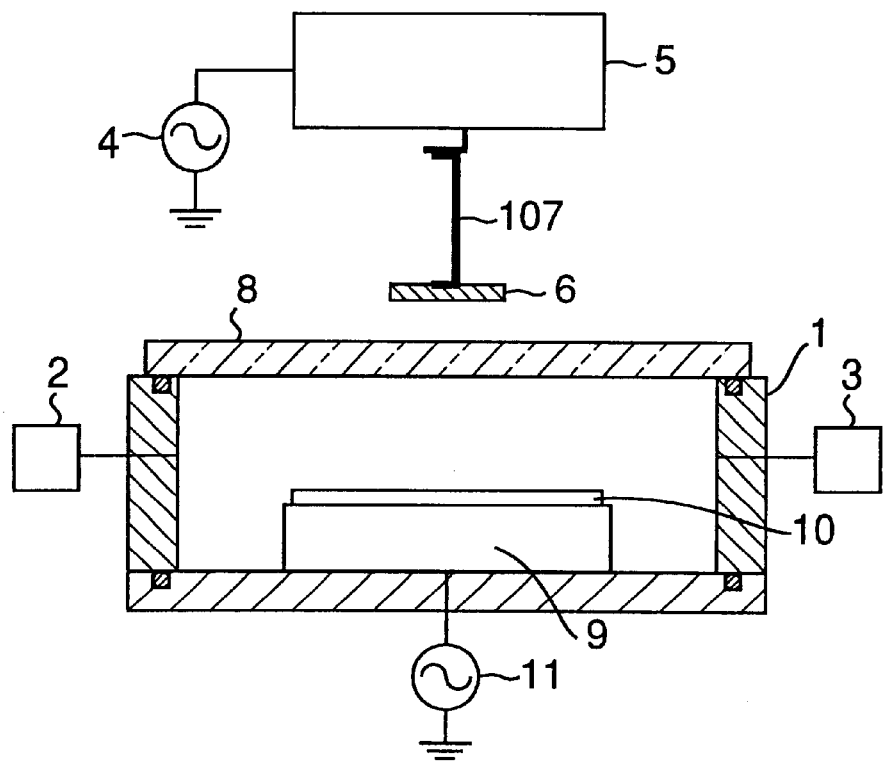
FIG. 7 is a sectional view showing the construction of a plasma processing apparatus used in a prior art example.

FIG. 6 shows a sectional view of a plasma processing apparatus used in the third embodiment of the present invention. In FIG. 6, when the interior of a vacuum chamber 1 is evacuated by a pump 3 operative as an evacuation device while a predetermined gas is introduced from a gas supply unit 2 into the chamber 1, and when a high-frequency electric power of 13.56 MHz is supplied to a substrate electrode 9 by a high-frequency power source 11 for the substrate electrode, with the interior of the chamber 1 kept under a predetermined pressure, via a matching circuit 5 and a high frequency coupler 7 for coupling the matching circuit 5 and the substrate electrode 9, plasma generation occurs in the vacuum chamber 1 and this makes it possible to carry out plasma processing, such as etching, deposition, and surface modification, with respect to a substrate 10 mounted on the substrate electrode 9.

An exploded view of the output portion 12 of the matching circuit 5, the high frequency coupler 7, and the substrate electrode 9, as well as description thereof, is omitted since it is same as that shown in FIG. 2, except that the antenna 6 is replaced by the substrate electrode 9.

A sectional view showing a section of the high frequency coupler 7 cut by a plane perpendicular to a straight line 15 connecting the center of a joint surface between the high frequency coupler 7 and the output portion 12 of the matching circuit 5 and the center of a joint surface between the high frequency coupler 7 and the substrate electrode 9 is same as that of FIG. 3. Therefore, the sectional view and the description are omitted.

Current distribution on the substrate electrode 9 is same as that in FIG. 4, except that the antenna 6 is replaced by the substrate electrode 9. Therefore, the drawing and the description is omitted.

In this way, where high frequency electric power is supplied to the substrate electrode 9 to cause plasma generation in the vacuum chamber 1, it is possible to carry out uniform plasma processing by application of the present invention.

In the foregoing description of the third embodiment of the present invention, only some of various variations conceivable with respect to the configuration of vacuum chamber 1, and the shape and the arrangement of the substrate electrode 9, which fall within the scope of the present invention, are shown by way of example. It is needless to say that various variations other than those exemplified herein may be conceivable in the application of the present invention. For example, in the embodiment of the present invention, the substrate electrode 9 is circular, but the substrate electrode 9 may be configured to be polygonal, elliptic, or otherwise.

In the foregoing description of the third embodiment of the present invention, plural line segments 19 arranged in a radial fashion which appear on a section of the high frequency coupler 7 cut by a plane perpendicular to a straight line 15 connecting the center of the joint surface 13 between the high frequency coupler 7 and the output portion 12 of the matching circuit 5 to the center of the joint surface 14 between the high frequency coupler 7 and the substrate electrode 9 are disposed in an approximate point symmetry relative to the center of the section. In this case, the higher the degree of symmetry, the more uniform current distribution on the substrate electrode 9 can be obtained. In the foregoing description, the line segments 19 are six in number by way of example. It is noted, however, that the larger the number of the line segments 19, the greater uniformity can be obtained with respect to the current distribution on the substrate electrode 9, resulting in greater current capacity.

In the above described third embodiment of the present invention, the joint surface between the high frequency coupler 7 and the output portion 12 of the matching circuit 5 is an approximately circular plane, and the joint surface between the high frequency coupler 7 and the substrate electrode 9 is also an approximately circular plane. However, the joint surface need not necessarily be a circular plane; and of course, various variations other than those exemplified herein may be conceivable depending upon the configuration of the joint portion.

In the above described third embodiment of the present invention, a tap for screwing-in a bolt is respectively provided adjacent the center of the joint surface between the high frequency coupler 7 and the output portion 12 of the matching circuit 5 and adjacent the center of the joint surface between the high frequency coupler 7 and the substrate electrode 9, so that the high frequency coupler 7 and the output portion 12 of the matching circuit 5 is fixed by the bolt and so that the high frequency coupler 7 and the substrate electrode 9 are fixed by the bolt. Such arrangement facilitates the mounting/removing of the matching circuit 5, an d the substrate electrode 9. Where the ease of the mount/remove operation is not so important, however, the connection of the matching circuit 5, the high frequency coupler 7, and the substrate electrode 9 is possible by other means, such as welding or integral molding.

In the above described third embodiment of the present invention, the frequency of the high frequency electric power is 13.56 MHz; needless to say, however, the frequency is not limited to this value.

In the foregoing first, second, and third embodiments, the surface portion of high frequency coupler in which high frequency current flows is comprised of silver. In order to reduce electric power loss, it is desirable that the surface portion is comprised of a material having an electric resistivity of not more than $2 \times 10^{-8}$ $\Omega \cdot m$. It is noted that the resistivity of silver is $1.62 \times 10^{-8}$ $\Omega \cdot m$.

In the foregoing description of first, second, and third embodiments, no explanation is made with respect to the magnitude of high frequency electric power for plasma processing. It may be said in this conjunction that where the magnitude of high frequency current is not less than 1 kW, a particularly good effect can be obtained. It has been found that the larger the high frequency power, particularly not less than 1 kW, the more remarkable is the effect of the present invention.

As may be apparent from the foregoing description, the high frequency coupler according to the present invention is a high frequency coupler for coupling two, that is, first and second high frequency elements, wherein a section of the coupler cut by a plane perpendicular to a straight line which connects the center of a joint surface between the coupler and the first high frequency element and the center of a joint surface between the coupler and the second high frequency element has a configuration such that the section contains a plurality of line segments arranged radially from a point adjacent the center of the section. This enables the flow of a current having good symmetrical characteristic.

The plasma processing apparatus according to the present invention is a plasma processing apparatus comprising: a vacuum chamber; a gas supply device for supplying gas into the vacuum chamber; an evacuation device for evacuating the interior of the vacuum chamber; an antenna or an opposite side positioned electrode for allowing high frequency power to act on the interior of the vacuum chamber; a high-frequency power source capable of supplying the high frequency power to the antenna or the opposite side positioned electrode; a matching circuit; a high frequency coupler for coupling the matching circuit and either one of the antenna and the opposite side positioned electrode; and a substrate electrode for placing a substrate in the vacuum chamber, wherein a section of the high frequency coupler cut by a plane perpendicular to a straight line which connects the center of a joint surface between the high frequency coupler and an output portion of the matching circuit and the center of a joint surface between the high frequency coupler and either one of the antenna and the opposite-side positioned electrode has a configuration such that the section contains a plurality of line segments arranged radially from a point adjacent the center (from the approximately center) of the section, and wherein the straight line which connects the center of a joint surface between the high frequency coupler and an output portion of the matching circuit and the center of a joint surface between the high frequency coupler and the antenna or the opposite-side positioned electrode passes about centrally through the substrate and is positioned on a straight line in generally perpendicular relation thereto. This enables uniform plasma generation.

The plasma processing apparatus according to the present invention is a plasma processing apparatus comprising: a vacuum chamber; a gas supply device for supplying gas into the vacuum chamber; an evacuation device for evacuating the interior of the vacuum chamber; a substrate electrode for placing a substrate thereon; a high frequency power source capable of supplying high frequency power to the substrate electrode; a matching circuit; and a high frequency coupler for coupling the matching circuit and the substrate electrode, wherein a section of the high frequency coupler cut by a plane perpendicular to a straight line which connects the center of a joint surface between the high frequency coupler and an output portion of the matching circuit and the center of a joint surface between the high frequency coupler and the substrate electrode has a configuration such that the section contains a plurality of line segments arranged radially from a point adjacent the center of the section, i.e., a point located in the vicinity of the center of the section, and wherein the straight line which connects the center of a joint surface between the high frequency coupler and an output portion of the matching circuit and the center of a joint surface between the high frequency coupler and the substrate electrode passes about centrally through the substrate and is positioned on a straight line which is nearly perpendicular to the substrate. This enables uniform plasma generation.

The plasma processing method according to the present invention is a plasma processing method wherein the interior of a vacuum chamber is evacuated while gas is fed into the vacuum chamber and, with the pressure in the vacuum chamber being controlled to a predetermined pressure, high frequency electric power is supplied to an antenna or an opposite side positioned electrode through a matching circuit and a high frequency coupler for coupling the matching circuit to the antenna or the opposite side positioned electrode, whereby plasma is generated in the vacuum chamber for treating a substrate placed on the substrate electrode. In the plasma processing method, a section of the high frequency coupler cut by a plane perpendicular to a straight line which connects the center of a joint surface between the high frequency coupler and an output portion of the matching circuit and the center of a joint surface between the high frequency coupler and the antenna or the opposite side positioned electrode has a configuration such that the section contains a plurality of line segments arranged radially from a point adjacent the center of the section, and in that the straight line which connects the center of a joint surface between the high frequency coupler and an output portion of the matching circuit and the center of a joint surface between the high frequency coupler and the antenna or the opposite side positioned electrode passes about centrally through the substrate and is positioned on a straight line which is nearly perpendicular to the substrate, whereby plasmas are generated which are nearly symmetrical in relation to the center of the substrate. Therefore, uniform plasma processing is possible.

The plasma processing method according to the present invention is a plasma processing method wherein the interior of a vacuum chamber is evacuated while gas is fed into the vacuum chamber and, with the pressure in the vacuum chamber being controlled to a predetermined pressure, high frequency electric power is supplied to a substrate electrode through a matching circuit and a high frequency coupler for coupling the matching circuit to the substrate electrode, whereby plasma is generated in the vacuum chamber for treating a substrate placed on the substrate electrode. In the plasma processing method, a section of the high frequency coupler cut by a plane perpendicular to a straight line which connects the center of a joint surface between the high frequency coupler and an output portion of the matching circuit and the center of a joint surface between the high frequency coupler and the substrate electrode has a configuration such that the section contains a plurality of line segments arranged radially from a point adjacent the center of the section, and the straight line which connects the center of a joint surface between the high frequency coupler and an output portion of the matching circuit and the center of a joint surface between the high frequency coupler and the substrate electrode passes about centrally through the substrate and is positioned on a straight line which is nearly perpendicular to the substrate, whereby plasmas are generated which are nearly symmetrical in relation to the center of the substrate. Therefore, uniform plasma processing is possible.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A high frequency coupler for coupling first and second high frequency elements, wherein a section of the high frequency coupler cut by a plane perpendicular to a straight line which connects a center of a joint surface between the coupler and a first high frequency element and a center of a joint surface between the coupler and a second high frequency element has a configuration such that the section contains a plurality of linear segments extending radially from approximately a center of the section, and wherein an end of the coupler defines an annular surface for directly contacting an area of the first or second high frequency element so as to define a generally annular contacting plane.

2. A high frequency coupler as claimed in claim 1, wherein the radially arranged plurality of line segments are generally point-symmetrically arranged in relation to the center of the section of the coupler cut by the plane perpendicular to the straight line which connects the center of the joint surface between the coupler and the first high frequency element and the center of the joint surface between the coupler and the second high frequency element.

3. A high frequency coupler as claimed in claim 1, wherein each end of the coupler defines an annular surface that is substantially perpendicular with respect to the straight line.

4. A high frequency coupler as claimed in claim 1, wherein a first end of the coupler includes a tap for receiving a threaded bolt approximately at a center of the joint surface between the coupler and the first high frequency element, and a second end of the coupler includes a tap for receiving a threaded bolt approximately at a center of the joint surface between the coupler and the second high frequency element.

5. A high frequency coupler as claimed in claim 1, wherein a surface portion of the coupler, in which a high frequency current flows, is comprised of a material having an electric resistivity of not more than $2 \times 10^{-8}$ $\Omega \cdot m$.

6. A plasma processing apparatus comprising:

a vacuum chamber;

a gas supply device for supplying gas into the vacuum chamber;

an evacuation device for evacuating an interior of the vacuum chamber;

an electromagnetic wave radiation device for allowing high frequency power to act on the interior of the vacuum chamber;

a high-frequency power source capable of supplying the high frequency power to the electromagnetic wave radiation device;

a matching circuit;

a high frequency coupler for coupling the matching circuit and the electromagnetic wave radiation device; and a substrate electrode for supporting a substrate in the vacuum chamber, wherein a section of the high frequency coupler cut by a plane perpendicular to a first straight line which connects a center of a joint surface between the high frequency coupler and an output portion of the matching circuit and a center of a joint surface between the high frequency coupler and the electromagnetic wave radiation device has, at a portion where the high frequency coupler contacts the electromagnetic wave radiation device, a configuration such that the section contains a plurality of linear segments radially projecting from approximately a center of the section, and the straight line passes approximately centrally through the substrate electrode and is generally perpendicular relative to the substrate electrode, wherein an end of the high frequency coupler defines an annular surface directly contacting an area of the matching circuit or the electromagnetic wave radiation device so as to define a generally annular contacting area.

7. A plasma processing apparatus as claimed in claim 6, wherein the radially arranged plurality of linear segments are generally point-symmetrically arranged in relation to the center of the section of the high frequency coupler cut by the plane perpendicular to the straight line.

8. A plasma processing apparatus as claimed in claim 6, wherein the high frequency coupler has opposite ends directly contacting the matching circuit and the electromagnetic wave radiation device, respectively, and each of the opposite ends defines an annular surface that is substantially perpendicular with respect to the straight line.

9. A plasma processing apparatus as claimed in claim 6, further comprising:

a first bolt received in a first tap formed in the high frequency coupler at approximately the center of the joint surface between the high frequency coupler and the output portion of the matching circuit; and a second bolt received in a second tap formed in the high frequency coupler at approximately the center of the joint surface between the high frequency coupler and the electromagnetic wave radiation device, wherein the high frequency coupler and the output portion of the matching circuit are fixed together by the first bolt and the high frequency coupler and the electromagnetic wave radiation device are fixed together by the second bolt.

10. A plasma processing apparatus as claimed in claim 6, wherein a surface portion of the high frequency coupler in which a high frequency current flows is comprised of a material having an electric resistivity of not more than $2 \times 10^{-8}$ Ω·m.

11. A plasma processing apparatus as claimed in claim 6, wherein said plasma processing apparatus is an etching apparatus.

12. A plasma processing apparatus as claimed in claim 6, wherein the annular surface of the high frequency coupler directly contacts a planar surface of the output portion of the matching circuit, and the planar surface of the output portion is larger than the annular surface of the high frequency coupler so that the entire annular surface is in contact with the planar surface of the matching circuit output portion, and wherein an opposite end of the high frequency coupler presents an annular surface, and the entire annular surface directly contacts an input portion of the electromagnetic wave radiation device.

13. A plasma processing apparatus comprising:

a vacuum chamber;

a gas supply device for supplying gas into a vacuum chamber;

an evacuation device for evacuating an interior of the vacuum chamber;

a substrate electrode, disposed in said vacuum chamber, for supporting a substrate thereon;

a high frequency power source capable of supplying high frequency power to the substrate electrode;

a matching circuit; and a high frequency coupler for coupling the matching circuit and the substrate electrode, wherein a section of the high frequency coupler that is cut by a plane perpendicular to a first straight line which connects a center of a joint surface between the high frequency coupler and an output portion of the matching circuit and a center of a joint surface between the high frequency coupler and the substrate electrode having, at a portion where the high frequency coupler contacts the substrate electrode, a configuration having a plurality of linear segments projecting radially from approximately a center of the section, the first straight line passing approximately centrally through the substrate electrode in a nearly perpendicular orientation relative to the substrate electrode, wherein an end of the high frequency coupler defines an annular surface directly contacting an area of the matching circuit or the substrate electrode so as to define a generally annular contacting area.

14. A plasma processing apparatus as claimed in claim 13, wherein the radially arranged plurality of linear segments are generally point-symmetrically arranged in relation to the center of the section of the high frequency coupler cut by the plane perpendicular to the first straight line.

15. A plasma processing apparatus as claimed in claim 13, further comprising:

a first bolt received in a first tap formed in the high frequency coupler at approximately the center of the joint surface between the high frequency coupler and the output portion of the matching circuit; and a second bolt received in a second tap that is formed in the high frequency coupler at approximately the center of the joint surface between the high frequency coupler and the substrate electrode, wherein the high frequency coupler and the output portion of the matching circuit are fixed together by the first bolt and the high frequency coupler and the substrate electrode are fixed together by the second bolt.

16. A plasma processing apparatus as claimed in claim 13, wherein a surface portion of the high frequency coupler in which a high frequency current flows is comprised of a material having an electric resistivity of not more than $2\times10^{-8}$ Ω·m.

17. A plasma processing apparatus as claimed in claim 13,
wherein the annular surface of the high frequency coupler directly contacts a planar surface of the output portion of the matching circuit, and the planar surface of the output portion is larger than the annular surface of the high frequency coupler so that the entire annular surface is in contact with the planar surface of the matching circuit output portion, and wherein an opposite end of the high frequency coupler presents an annular surface, and the entire annular surface directly contacts an input portion of the substrate electrode.

18. A plasma processing method comprising:
connecting a matching circuit and an electromagnetic wave radiation device with a high frequency coupler so that current can flow in a section of the high frequency coupler cut by a plane that is perpendicular to a first straight line which connects a center of a joint surface between the high frequency coupler and an output portion of the matching circuit and a center of a joint surface between the high frequency coupler and the electromagnetic wave radiation device, the section having a configuration such that the section contains a plurality of linear segments for flowing the current, the linear segments projecting radially from approximately a center of the section, and the first straight line passing approximately centrally through a substrate placed on a substrate electrode disposed in a vacuum chamber;

feeding a gas into the interior of the vacuum chamber;

evacuating the interior of the vacuum chamber while the gas is fed into the vacuum chamber;

controlling a pressure in the vacuum chamber to a predetermined pressure;

supplying high frequency electric power through the matching circuit and the high frequency coupler so that current flows in a section of the high frequency coupler, wherein the current flows in the joint surface between the high frequency coupler and an output portion of the matching circuit, and the current flows in the joint surface between the high frequency coupler and the electromagnetic wave radiation device, and either one of the joint surfaces defines a generally annular area; and generating plasma in the vacuum chamber for treating the substrate, the generated plasma being nearly symmetrical across the center of the substrate.

19. A plasma processing method as claimed in claim 18, wherein the current flows in the radially arranged plurality of linear segments which are generally point-symmetrically arranged in relation to the center of the section of the high frequency coupler cut by the plane perpendicular to the first straight line.

20. A plasma processing method as claimed in claim 18, wherein the current flows in the joint portion where the high frequency coupler and the output portion of the matching circuit are fixed together by a first bolt that is screwed into a tap provided at approximately the center of the joint surface between the high frequency coupler and the output portion of the matching circuit, and the current flows in the joint portion where the high frequency coupler and the electromagnetic wave radiation device are fixed together by a second bolt that is screwed into a tap provided at approximately the center of the joint surface between the high frequency coupler and the electromagnetic wave radiation device.

21. A plasma processing method as claimed in claim 18, wherein the current flows in a surface portion of the high frequency coupler which is comprised of a material having an electric resistivity of not more than $2\times10^{-8}$ Ω·m.

22. A plasma processing method as claimed in claim 18, wherein the magnitude of the high frequency electric power is not less than 1 kw.

23. A plasma processing method comprising:
evacuating an interior of a vacuum chamber while gas is fed into the vacuum chamber;

controlling a pressure in the vacuum chamber at a predetermined pressure;

supplying high frequency electric power to a substrate electrode through a matching circuit and a high frequency coupler coupling the matching circuit to the substrate electrode so that current flows in a section of the high frequency coupler cut by a plane perpendicular to a first straight line which connects a center of a joint surface between the high frequency coupler and an output portion of the matching circuit and a center of a joint surface between the high frequency coupler and the substrate electrode, the section having a configuration such that the section contains a plurality of linear segments for flowing the current, wherein the linear segments project radially from approximately a center of the section, and the first straight line passes approximately centrally through a substrate placed on the substrate electrode in a nearly perpendicular orientation relative to the substrate, wherein the current flows in the joint surface between the high frequency coupler and the output portion of the matching circuit, and the current flows in the joint surface between the high frequency coupler and the substrate electrode, and at least one of the joint surfaces defining a generally annular area; and generating plasma in the vacuum chamber for treating the substrate, the generated plasma being nearly symmetrical across the center of the substrate.

24. A plasma processing method as claimed in claim 23, wherein the current flows in the radially arranged plurality of linear segments which are generally point-symmetrically arranged in relation to the center of the section of the high frequency coupler cut by the plane perpendicular to the first straight line.

25. A plasma processing method as claimed in claim 23, wherein the high frequency coupler and the output portion of the matching circuit are fixed together by a first bolt that is screwed into a tap provided approximately at the center of the joint surface between the high frequency coupler and the output portion of the matching circuit, and the high frequency coupler and the substrate electrode are fixed together by a second bolt that is screwed into a tap provided approximately at the center of the joint surface between the high frequency coupler and the substrate electrode.

26. A plasma processing method as claimed in claim 23, wherein the current flows in a surface portion of the high frequency coupler which is comprised of a material having an electric resistivity of not more than $2\times10^{-8}$ Ω·m.

27. A plasma processing method as claimed in claim 23, wherein the magnitude of the high frequency electric power is not less than 1 kw.

* * * * *